(12) United States Patent
Rowsell et al.

(10) Patent No.: US 11,612,075 B2
(45) Date of Patent: Mar. 21, 2023

(54) COMPUTER CASE WITH MODULAR I/O PANELS

(71) Applicant: SIMPLY NUC, INC., Round Rock, TX (US)

(72) Inventors: Aaron Rowsell, North Salt Lake, UT (US); John Woellner, Round Rock, TX (US); Charles B. Abdouch, Round Rock, TX (US)

(73) Assignee: SIMPLY NUC, INC., Round Rock, TX (US)

( * ) Notice: Subject to any disclaimer, the term of this patent is extended or adjusted under 35 U.S.C. 154(b) by 0 days.

(21) Appl. No.: 17/352,204

(22) Filed: Jun. 18, 2021

(65) Prior Publication Data

US 2021/0400833 A1 Dec. 23, 2021

Related U.S. Application Data

(60) Provisional application No. 63/041,082, filed on Jun. 18, 2020.

(51) Int. Cl.
*H05K 7/14* (2006.01)
(52) U.S. Cl.
CPC ......... *H05K 7/1488* (2013.01); *H05K 7/1439* (2013.01); *H05K 7/1452* (2013.01); *H05K 7/1487* (2013.01)
(58) Field of Classification Search
None
See application file for complete search history.

(56) References Cited

U.S. PATENT DOCUMENTS

| 4,652,969 | A | * | 3/1987 | Stegenga | H05K 5/00 361/801 |
| 5,269,598 | A | * | 12/1993 | Liu | G06F 1/183 361/679.48 |
| 5,278,351 | A | * | 1/1994 | Herrick | H05K 5/0013 361/818 |
| 5,600,538 | A | * | 2/1997 | Xanthopoulos | G06F 1/181 361/679.6 |
| 5,865,518 | A | * | 2/1999 | Jarrett | G06F 1/185 361/679.48 |
| 6,284,970 | B1 | * | 9/2001 | Buskmiller | H05K 9/0016 361/752 |
| 6,304,438 | B1 | * | 10/2001 | Liu | G06F 1/181 361/740 |
| 8,408,662 | B2 | * | 4/2013 | Wang | G06F 1/181 439/567 |
| 9,927,849 | B1 | * | 3/2018 | Lai | G06F 1/183 |
| 2003/0030972 | A1 | * | 2/2003 | Laio | G06F 1/181 361/679.6 |
| 2004/0075974 | A1 | * | 4/2004 | Chen | G06F 1/184 361/679.3 |

(Continued)

*Primary Examiner* — James Wu
*Assistant Examiner* — Christopher L Augustin
(74) *Attorney, Agent, or Firm* — Kunzler Bean & Adamson (57) ABSTRACT

Disclosed is a computer case with I/O panels on opposite sides of the case, and a method for providing the case. The case includes a top, a bottom, a back side that is opposite a front side, and a right side that is opposite a left side. The case also includes a front I/O opening formed in the front side that receives a front I/O panel. The computer case also includes a rear I/O opening in the back side that receives a rear I/O panel.

18 Claims, 10 Drawing Sheets

(56) References Cited

U.S. PATENT DOCUMENTS

| | | | | |
|---|---|---|---|---|
| 2005/0213294 A1* | 9/2005 | Lambert | ................ | G06F 1/181 |
| | | | | 361/679.02 |
| 2008/0151488 A1* | 6/2008 | Chen | ...................... | G06F 1/183 |
| | | | | 361/825 |
| 2011/0310554 A1* | 12/2011 | Hiyama | ................ | G06F 1/181 |
| | | | | 248/224.8 |
| 2012/0020016 A1* | 1/2012 | Cheng | .................... | G06F 1/184 |
| | | | | 361/679.48 |
| 2013/0063005 A1* | 3/2013 | Qian | ...................... | G06F 1/181 |
| | | | | 312/223.2 |

* cited by examiner

COMPUTER CASE WITH MODULAR I/O PANELS

CROSS-REFERENCES TO RELATED APPLICATIONS

This application claims the benefit of U.S. Provisional Patent Application No. 63/041,082 entitled "COMPUTER CASE WITH MODULAR I/O PANELS and filed on Jun. 18, 2020, for Aaron Rowsell, et. al, which is incorporated herein by reference.

FIELD

This disclosure relates to cases or housings for computing devices and more particularly relates to computer case with opposing modular I/O panels.

BACKGROUND

Currently, computing devices are mounted on motherboards and installed in computer cases or housings. The cases typically include mount points that correspond a with holes in the motherboards that allow the motherboard to attach to the computer case. The motherboard is generally attached to the case with fasteners such as screws. The motherboards include multiple I/O ports for connecting to external devices. These I/O ports must be accessible from outside the computer case. In the case of small form factor motherboards, the computer case is often designed for a specific generation of the motherboard and arrangement of I/O ports. As computer hardware evolves, motherboards change and so does the positioning of the I/O ports, which in turn requires a new computer case design for each version of motherboard.

SUMMARY

An apparatus for a module computer case is disclosed. A method is also described that provides the computer case. The computer case includes a top, a bottom, a back side that is opposite a front side, and a right side that is opposite a left side. The computer case also includes a front I/O opening formed in the front side that receives a front I/O panel. The computer case also includes a rear I/O opening in the back side that receives a rear I/O panel.

The apparatus also includes a bottom panel having a first upwardly extending tab configured to engage an outer surface of the front I/O panel, a second upwardly extending tab configured to engage an inner surface of the front I/O panel, a third upwardly extending tab configured to engage an outer surface of the rear I/O panel, and a fourth upwardly extending tab configured to engage an inner surface of the rear I/O panel. In certain examples, the apparatus also includes a shell disposed around the computer chassis. The shell includes openings configured to receive the front I/O panel.

In certain examples, the rear I/O panel is configured with a layout of I/O openings that conform with a layout of I/O ports of a selected motherboard. The rear I/O panel also includes inwardly extending tabs and outwardly extending tabs configured to engage with inner surfaces and outer surfaces, respectively, of the computer chassis. In certain examples, at least one of the inwardly extending tabs and the outwardly extending tabs includes a return flange.

In certain examples, the front I/O panel is configured with a layout of I/O openings that conform with a layout of I/O ports or buttons of a selected motherboard. The front I/O panel, in certain examples, includes inwardly extending tabs and outwardly extending tabs configured to engage with inner surfaces and outer surfaces, respectively, of the computer chassis. A top panel of the top may include a downwardly extending lip configured to locate the rear I/O panel.

In certain examples, a computer chassis is described that has a top, a bottom, a front side, a back side that is opposite the front side, a left side, and a right side that is opposite the left side, a front input/output (I/O) opening formed in the front side and configured to receive a front I/O panel, where the front I/O panel comprises at least one snap connector configured to engage a slot of the computer chassis, and a rear I/O opening in the back side and configured to receive a rear/O panel.

The rear/O panel may include at least one snap connector configured to engage a slot of the computer chassis. In some examples, the computer chassis includes a bottom panel having a first upwardly extending tab configured to engage an outer surface of the front I/O panel, a second upwardly extending tab configured to engage an inner surface of the front I/O panel, a third upwardly extending tab configured to engage an outer surface of the rear/O panel, and a fourth upwardly extending tab configured to engage an inner surface of the rear I/O panel.

In certain examples, the computer chassis includes a shell disposed around the computer chassis. The rear I/O panel is configured with a layout of I/O openings that conform with a layout of I/O ports of a selected motherboard. The front I/O panel, in certain examples, is configured with a layout of I/O openings that conform with a layout of I/O ports or buttons of a selected motherboard.

In certain examples, each of the front I/O panel and the rear I/O panel comprises a perimeter, and a plurality of snap connectors disposed on the perimeter. Each of the snap connectors is positioned and aligned with a corresponding slot formed in either the front I/O opening or the rear I/O opening.

The method, in certain examples, includes providing a top, a bottom, a front side, a back side that is opposite the front side, a left side, and a right side that is opposite the left side. The method may also include providing a front input/output (I/O) opening formed in the front side and configured to receive a front I/O panel, where the front I/O panel comprises at least one snap connector configured to engage a slot of the computer chassis, and providing a rear I/O opening in the back side and configured to receive a rear I/O panel. The method includes, in certain examples, inserting the front I/O panel in the front I/O opening, and inserting the rear I/O panel in the rear I/O opening. The method may also include attaching a shell to the computer chassis.

BRIEF DESCRIPTION OF THE DRAWINGS

In order that the advantages of the embodiments of the subject disclosure will be readily understood, a more particular description of the embodiments will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all the items are mutually exclusive and/or mutually inclusive, unless expressly specified otherwise. The terms "a," "an," and "the" also refer to "one or more" unless expressly specified otherwise. The term "and/or" indicates embodiments of one or more of the listed elements, with "A and/or B" indicating embodiments of element A alone, element B alone, or elements A and B taken together.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

Reference to terms such as "left", "right", "top", "bottom", "front" and "back" are intended for use in respect to the orientation of the particular feature, structure, or element within the figures depicting embodiments of the invention. It would be evident that such directional terminology with respect to the actual use of a device has no specific meaning as the device can be employed in a multiplicity of orientations by the user or users.

The description of elements in each figure may refer to elements of proceeding figures. Like numbers refer to like elements in all figures, including alternate embodiments of like elements.

Figure 1A:
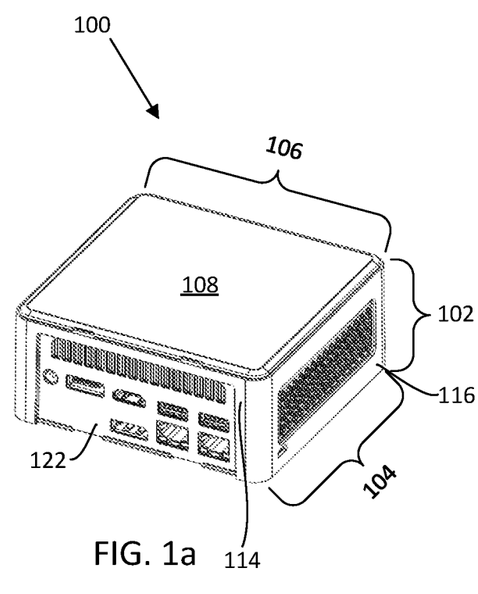
FIGS. 1a-1c are perspective view diagrams illustrating examples of a computer enclosure ("enclosure"), according to examples of the subject disclosure.
Figure 1B:
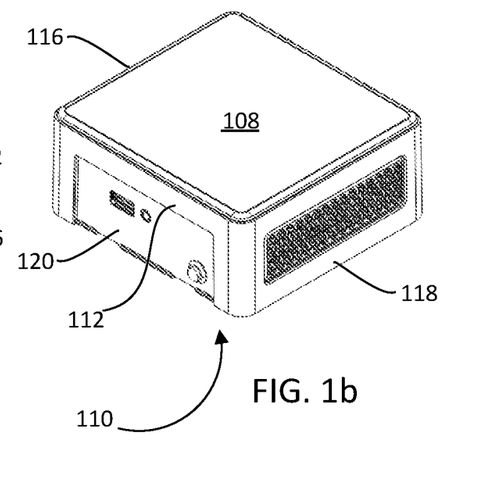
Figure 1C:
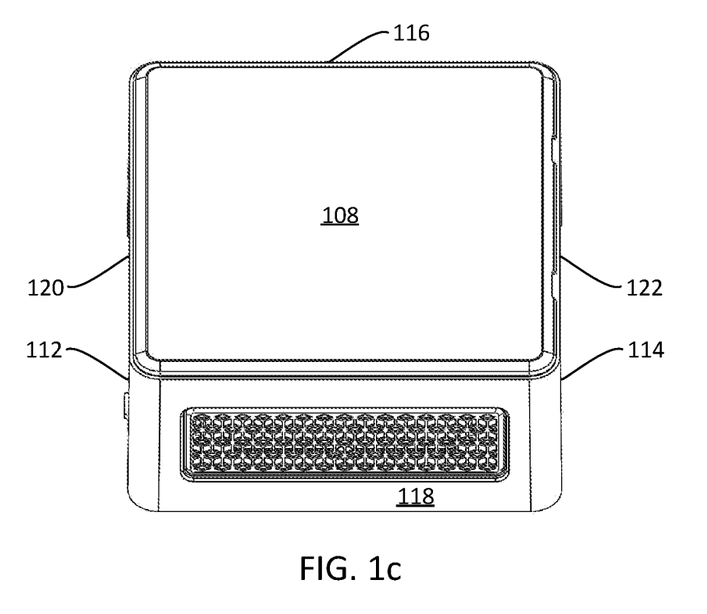

FIGS. 1a-1c are perspective view diagrams illustrating examples of a computer case or enclosure ("enclosure") 100, according to examples of the subject disclosure. The enclosure 100, in certain examples, is formed with a height 102, length 104, and a width 106. Although depicted with a length 104 and a width 106 that are substantially equal, it is contemplated that the enclosure 100 may have any reasonable height 102, length 104, and width 106.

In certain examples, the enclosure 100 is formed with a top side 108, a bottom side 110, a front side 112, a back or rear side 114, a left side 116, and a right side 118. The different "sides" of the enclosure 100 are identified here for convenience and clarity when discussing the input/output panels, however it is to be understood that the input/output panels may be implemented in any surface of the enclosure 100.

As mentioned, the enclosure 100, in certain examples, includes a front input/output (I/O) panel 120 and a rear I/O panel 122. The front I/O panel 120 is disposed opposite the rear I/O panel 122. For example, if the front I/O panel 120 is disposed in the front side 112 of the enclosure 100, then the rear I/O panel is disposed in the rear side 114. Similarly, if the front I/O panel 120 is disposed in the right side 118, for example, then the rear I/O panel 122 may be disposed in the left side 116.

In certain examples, and as will be discussed below in greater detail, disposed within the enclosure 100 are the components necessary to operate an electronic computing device. Some examples of these components include, but are not limited to, a power supply, a motherboard, a processor, a heat management device (e.g., a fan), a memory (e.g., random access memory), non-volatile computer readable media, and optional cards including interface boards that provide audio/video and/or networking capabilities. The enclosure 100, in certain examples, provides a mounting structure for these components.

The front I/O panel 120 and the rear I/O panel 122 are modular and replaceable, and configured according to the I/O ports of the motherboard. Beneficially, this allows for the enclosure 100 to be compatible with various motherboards and I/O layouts. For example, FIG. 1a depicts a specific I/O layout having multiple network ports disposed below multiple USB ports. It is contemplated that either the front I/O panel 120 or the rear I/O panel 122 is configurable in any reasonable I/O layout as required by a selected motherboard.

Figure 2:
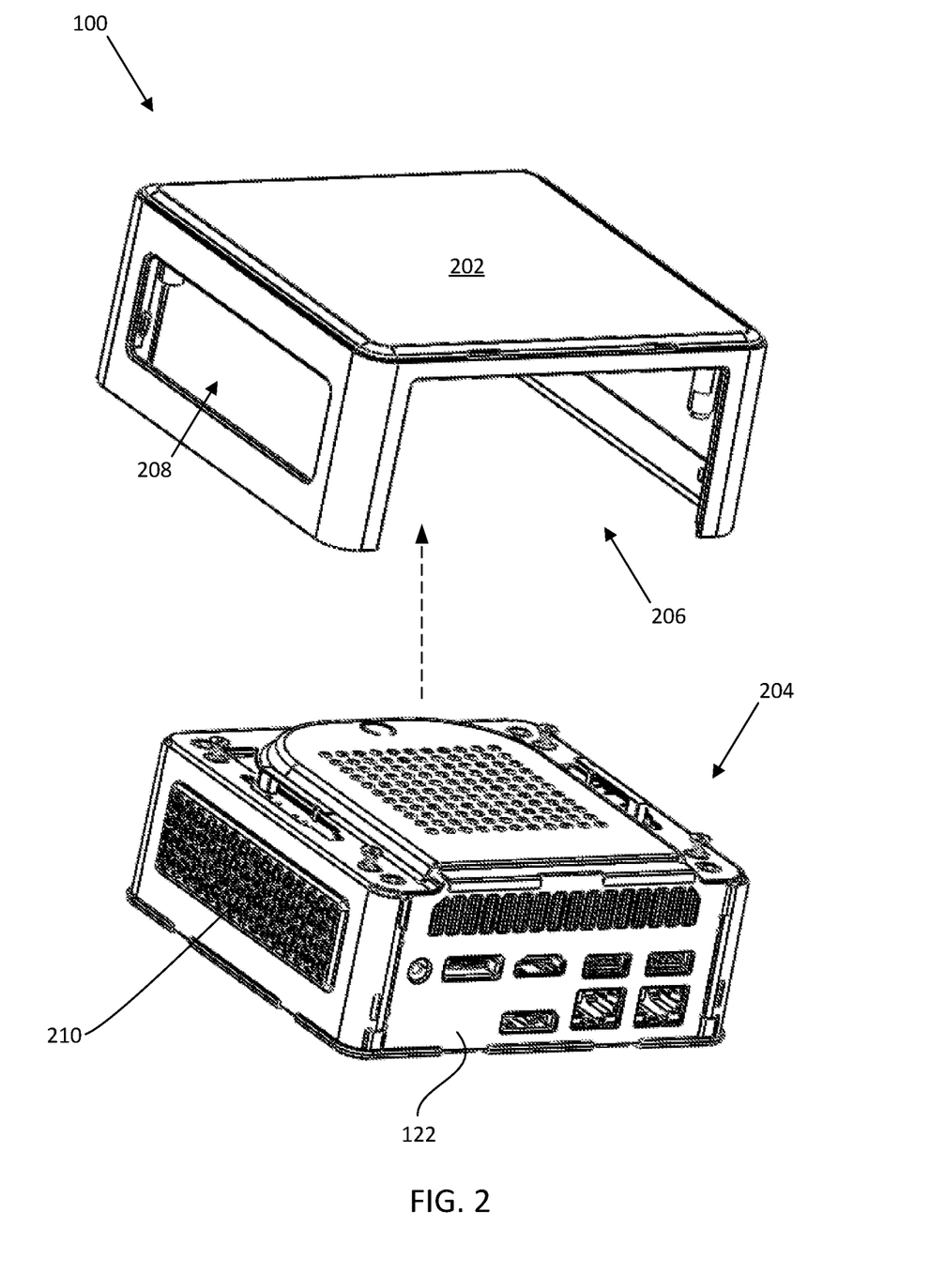
FIG. 2 is a perspective exploded-view diagram illustrating one example of the enclosure, according to examples of the subject disclosure.

FIG. 2 is a perspective exploded-view diagram illustrating one example of the enclosure 100, according to examples of the subject disclosure. The enclosure 100, in certain examples, is formed of a shell 202 disposed around a chassis 204. The shell 202, as depicted, may be formed with various cutouts 206 and openings 208 to accommodate access to the front I/O panel 120, rear I/O panel 122, or ventilation openings 210 in the chassis 204. The shell 202 may be formed of any rigid material, including but not limited M to, any suitable polymer or polymer blend, any suitable metal or metal alloy, any suitable composite material, or any suitable ceramic material. In certain examples, the shell 202 formed of injection molded acrylonitrile butadiene styrene (ABS).

The chassis 204, as will be described in greater detail below, is formed of various conjoined panels that support the internal components. In certain examples, the chassis 204 is formed of a metal or metal alloy. For example, the chassis 204 may be formed of stamped sheet metal panels fastened to each other. Various openings, for ventilation and/or I/O access, are formed in the panels of the chassis 204.

Figure 3A:
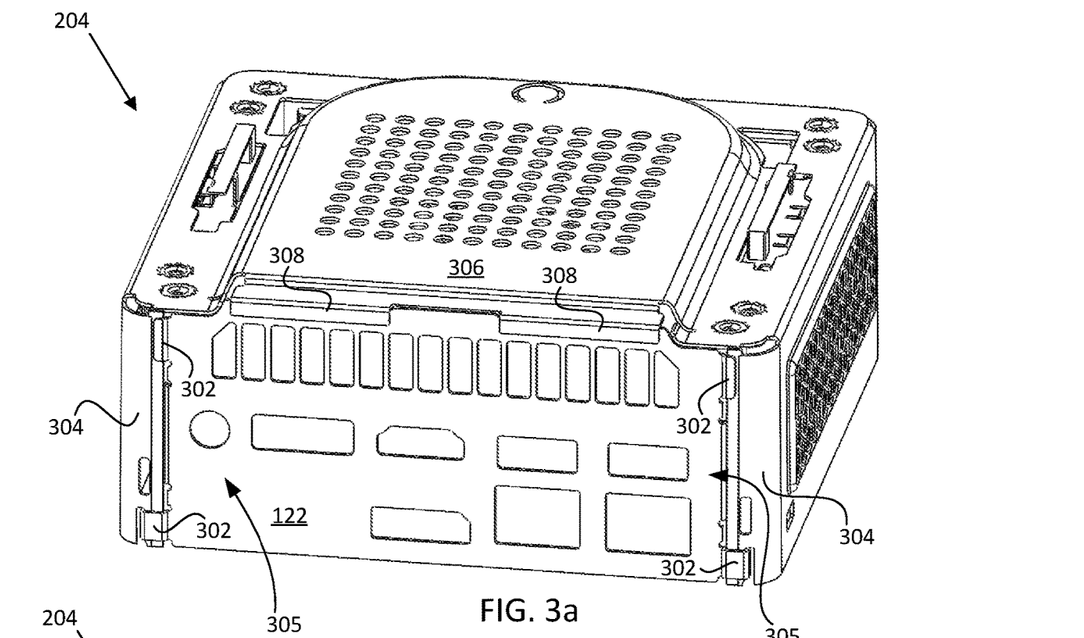
FIGS. 3a and 3b are perspective view diagrams illustrating examples of the chassis, in accordance with examples of the subject disclosure.

FIGS. 3a and 3b are perspective view diagrams illustrating examples of the chassis 204, in accordance with examples of the subject disclosure. In particular, FIG. 3a depicts the chassis 204 and the rear I/O panel 122. As discussed above, the rear I/O panel 122 is removable and replaceable with a rear I/O panel 122 that conforms to a layout of I/O ports of a selected motherboard. The rear I/O panel 122, in certain examples, is formed of sheet metal, and may be formed with side tabs 302 extending outward laterally that are configured to engage with side panels 304 of the chassis 204. In other words, the side tabs 302 extend towards a side panel 304 of the chassis 204 instead of a top panel 306. The side tabs 302 may be formed with inwardly and outwardly extending tabs such that at least one side tab 302 engages an outer surface of the side panel 304 while at least one side tab 302 engages an inner surface of the side panel 304. Accordingly, the side tabs 302 secure the sides 305 of the rear I/O panel 122 to the chassis 204. The side tabs 302 will be discussed in greater detail below (see FIGS. 4a and 4b). In other examples, the rear I/O panel 122 may be formed with upwardly or downwardly extending tabs.

In certain examples, the top panel 306 is formed with a downwardly extending lip 308 or tab that is configured to locate and seat the rear I/O panel 122 with reference to the chassis 204. The lip 308 may be split, as depicted, or in the alternative, a single continuous structure. The lip 308 is formed in the top panel 306 adjacent a rear panel I/O opening (see FIG. 5c). Beneficially, positioning the rear I/O panel 122 is a simple matter of sliding the rear I/O panel 122 upward, with the side tabs 302 engaging the side panels 304, towards the top panel 306 and fastening a bottom panel (see FIGS. 5a-5c) to the chassis 204.

Figure 3B:
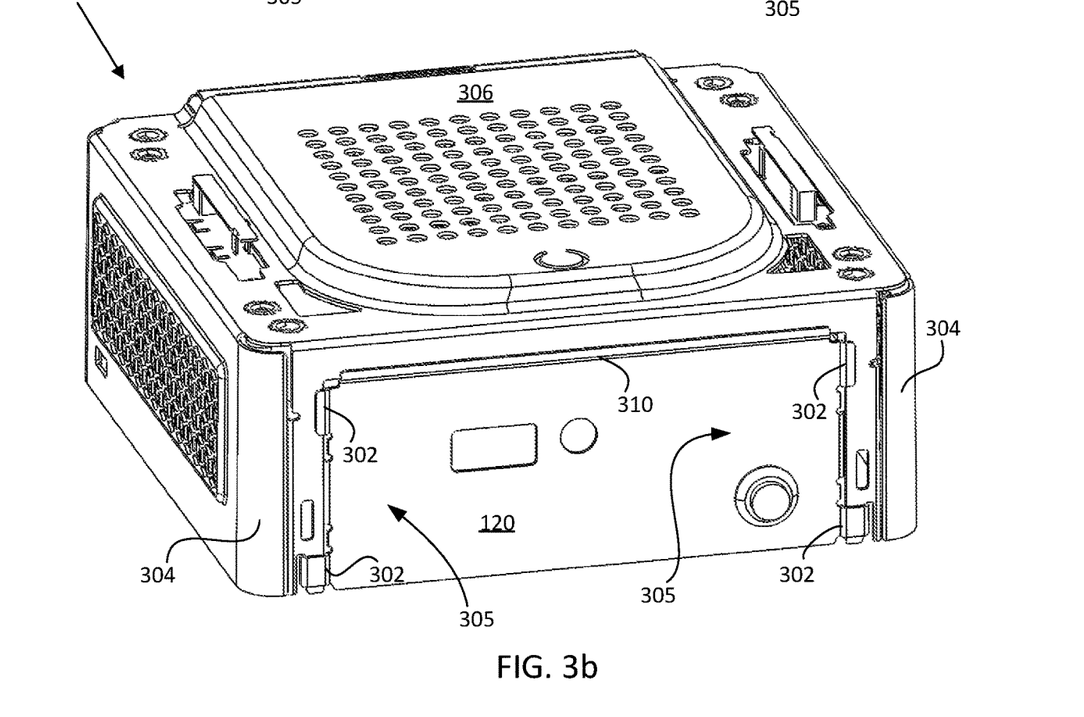

FIG. 3b depicts the chassis 204 and the front I/O panel 120. The front I/O panel 120 is also removable and replaceable with a front I/O panel 120 that conforms to a layout of I/O ports of a selected motherboard. The front I/O panel 120, in certain examples, is formed of sheet metal, and may be formed with side tabs 302 extending outward laterally that are configured to engage with side panels 304 of the chassis 204. In other words, the side tabs 302 extend towards a side panel 304 of the chassis 204 instead of a top panel 306. The side tabs 302 may be formed with inwardly and outwardly extending tabs such that at least one side tab 302 engages an outer surface of the side panel 304 while at least one side tab 302 engages an inner surface of the side panel 304. Accordingly, the side tabs 302 secure the sides 305 of the front I/O panel 120 to the chassis 204. The side tabs 302 will be discussed in greater detail below (see FIGS. 4a and 4b). In other examples, the front I/O panel 120 may be formed with upwardly or downwardly extending tabs.

In certain examples, the front I/O panel 120 is formed with an upwardly extending lip 310 or tab that is configured to locate and seat the rear I/O panel 122 with reference to the chassis 204. The lip 308 may be split, as depicted, or in the alternative, a single continuous structure. The lip 308 is formed in the top panel 306 adjacent a rear panel I/O opening (see FIG. 5c). Beneficially, positioning the rear I/O panel 122 is a simple matter of sliding the rear I/O panel 122 upward, with the side tabs 302 engaging the side panels 304, towards the top panel 306 and fastening a bottom panel (see FIGS. 5a-6b) to the chassis 204.

Figure 4A:
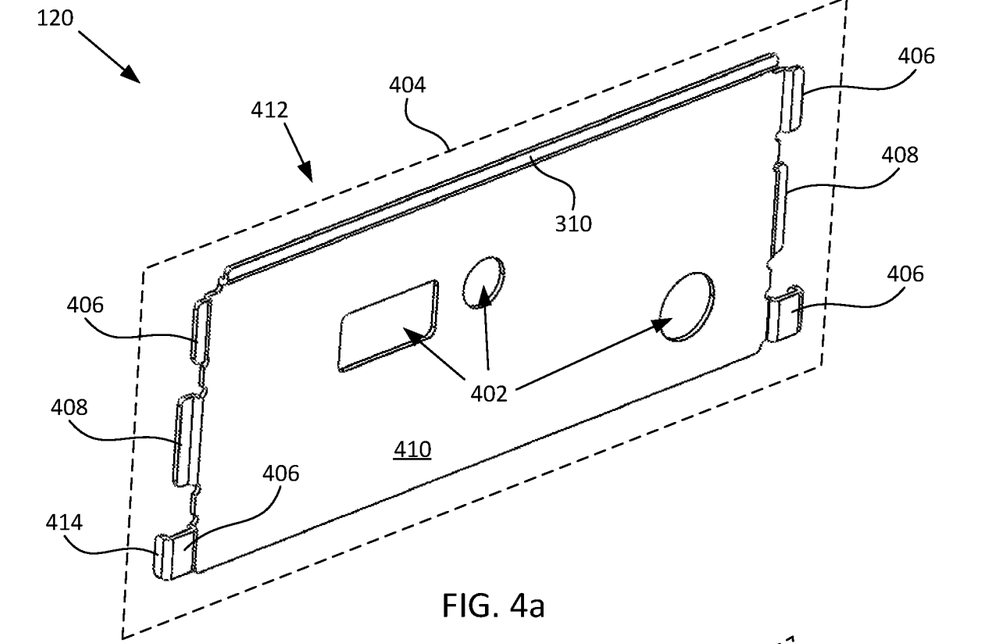
FIG. 4a is a perspective diagram illustrating one example of the front I/O panel, according to examples of the subject disclosure.

FIG. 4a is a perspective diagram illustrating one example of the front I/O panel 120, according to examples of the subject disclosure. In the depicted embodiment, the front I/O panel 120 includes openings 402 for various I/O inputs, including but not limited to, audio jacks, USB ports, and on/off buttons. The front I/O panel 120, in certain examples, is substantially planar and defines a plane 404.

In certain examples, the front I/O panel 120 is formed with side tabs 406, 408 extending outward from the front I/O panel 120 to engage the side panel 304 of the chassis 204. The front I/O panel 120 is configured with at least one side tab 406 that extends sideways and "outward" and at least one side tab 408 that extends sideways and "inward." As used here with the depicted example, "outward" refers to a side tab 406 that is configured to engage an outer surface of the side panel 304. In certain examples, the front I/O panel 120 forms a surface that is flush with the edges of the side panels 304, and accordingly the side tabs 406, 408 extend sideways and to either an inner side (i.e., corresponding to an interior of the chassis 204) or the outer side of the plane 404 (i.e., corresponding to an exterior of the chassis 204). The front I/O panel 120 is formed with an outer surface 410 and an opposing inner surface 412.

In certain examples, the "outer" side tabs 406 extend sideways and outward away from the outer surface 410 in a direction that is away from the interior of the chassis 204. Similarly, the "inner" side tab 408 extends sideways and inward away from the inner surface 412. Any reasonable number of outer side tabs 406 and/or inner side tabs 408 may be implemented. In certain examples, each side of the front I/O panel 120 includes at least one outwardly extending side tab 406 and one inwardly extending side tab 408. In some examples, one or more of the side tabs may include a return flange 414 that is configured to help locate and secure the front I/O panel 120 to the chassis 204. As described above, the front I/O panel 120 also includes the lip 310 that, in certain examples, extends outward and is configured to engage an outer surface of the top panel 306 of the chassis 204. In other examples, the lip 310 includes sections of inwardly and outwardly extending tabs, in a manner similar to the side tabs 406, 408.

Figure 4B:
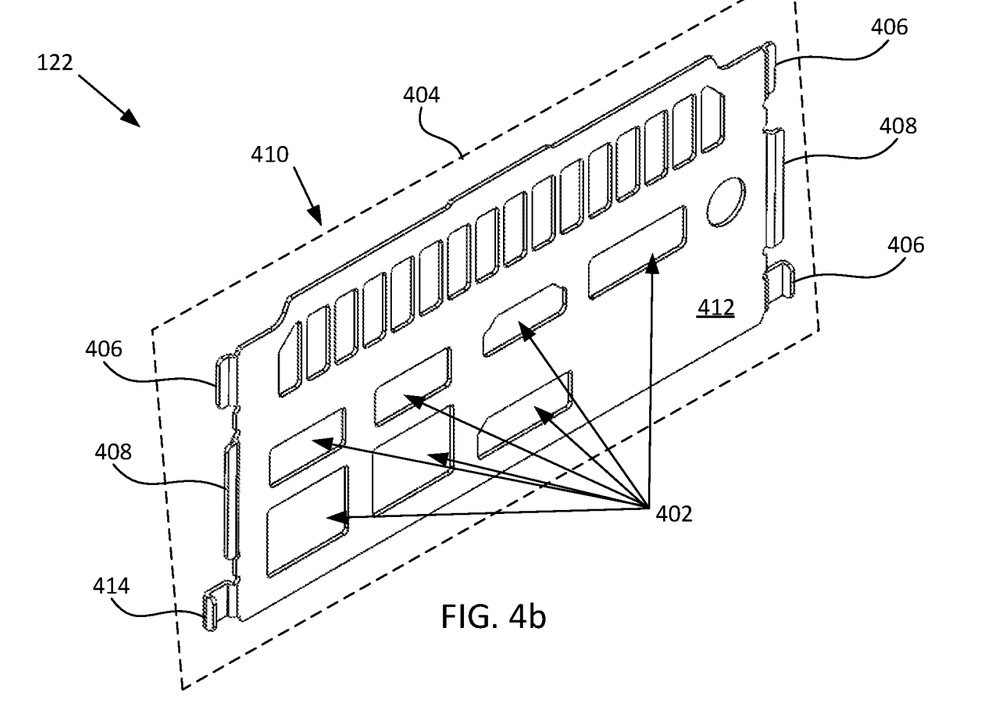
FIG. 4b is a perspective diagram illustrating one example of the rear I/O panel, according to examples of the subject disclosure.

FIG. 4b is a perspective diagram illustrating one example of the rear I/O panel 122, according to examples of the subject disclosure. In the depicted embodiment, the rear I/O panel 122 includes openings 402 for various I/O inputs, including but not limited to, audio jacks, USB ports, HDMI, DisplayPort, network jacks, etc. Other openings may be provided to aid in ventilation of the interior area of the chassis 204. The rear I/O panel 122, in certain examples, is substantially planar and defines a plane 404.

In certain examples, the rear I/O panel 122 is formed with side tabs 406, 408 extending outward from the rear I/O panel 122 to engage the side panel 304 of the chassis 204. The rear I/O panel 122 is configured with at least one side tab 406 that extends sideways and "outward" and at least one side tab 408 that extends sideways and "inward." As used here with the depicted example, "outward" refers to a side tab 406 that is configured to engage an outer surface of the side panel 304. In certain examples, the rear I/O panel 122 forms a surface that is substantially flush with the edges of the side panels 304, and accordingly the side tabs 406, 408 extend sideways and to either an inner side (i.e., corresponding to an interior of the chassis 204) or the outer side of the plane 404 (i.e., corresponding to an exterior of the chassis 204). The rear I/O panel 122 is formed with an outer surface 410 and an opposing inner surface 412.

In certain examples, the "outer" side tabs 406 extend sideways and outward away from the outer surface 410 in a direction that is away from the interior of the chassis 204. Similarly, the "inner" side tab 408 extends sideways and inward away from the inner surface 412. Any reasonable number of outer side tabs 406 and/or inner side tabs 408 may be implemented. In certain examples, each side of the rear I/O panel 122 includes at least one outwardly extending side tab 406 and one inwardly extending side tab 408. In some examples, one or more of the side tabs may include a return flange 414 that is configured to help locate and secure the rear I/O panel 122 to the chassis 204.

Figure 5A:
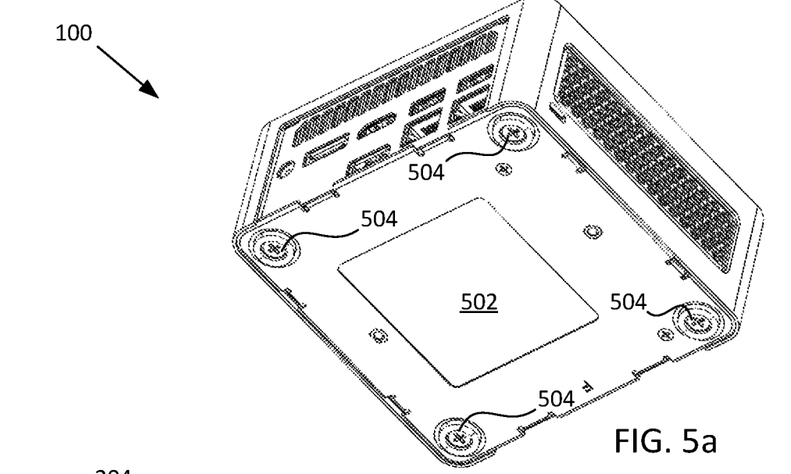
FIGS. 5a-5c are perspective view diagrams illustrating examples of the bottom panel, according to examples of the subject disclosure.
Figure 5B:
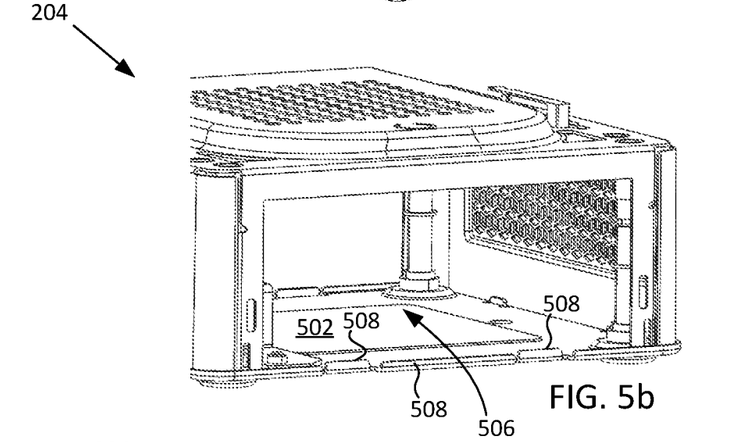
Figure 5C:
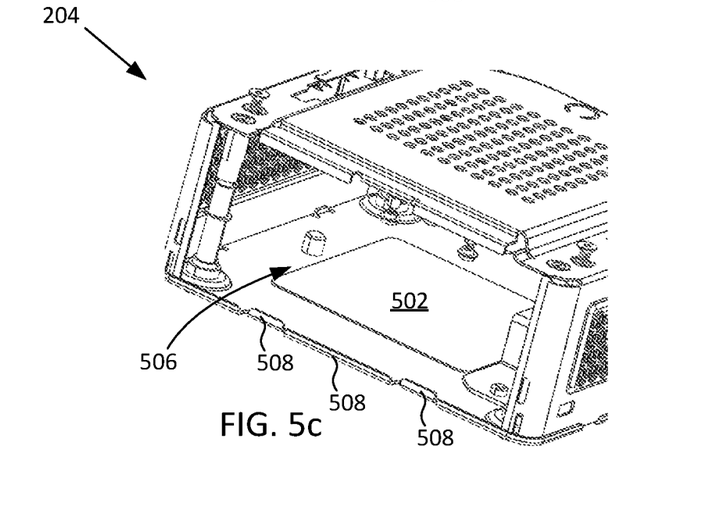

FIGS. 5a-5c are perspective view diagrams illustrating examples of the bottom panel 502, according to examples of the subject disclosure. The bottom panel 502 is disposed on the bottom side 110 of the chassis 204 and is releasably coupled to the p chassis 204. In certain examples, fasteners 504 secure the bottom panel 502 to the chassis 204. The bottom panel 502 is configured to couple to the chassis 204 and secure the front I/O panel 120 and the rear I/O panel 122 in I/O openings 506 in the chassis 204.

In certain examples, the bottom panel includes one or more upwardly extending tabs 508. Adjacent upwardly extending tabs 508 may be offset such that one of the tabs 508 engages an inner surface 412 of either the front or rear I/O panel 120, 122, and one of the tabs 508 engages an outer surface 410 of either the front or rear I/O panel 120, 122.

Figure 6A:
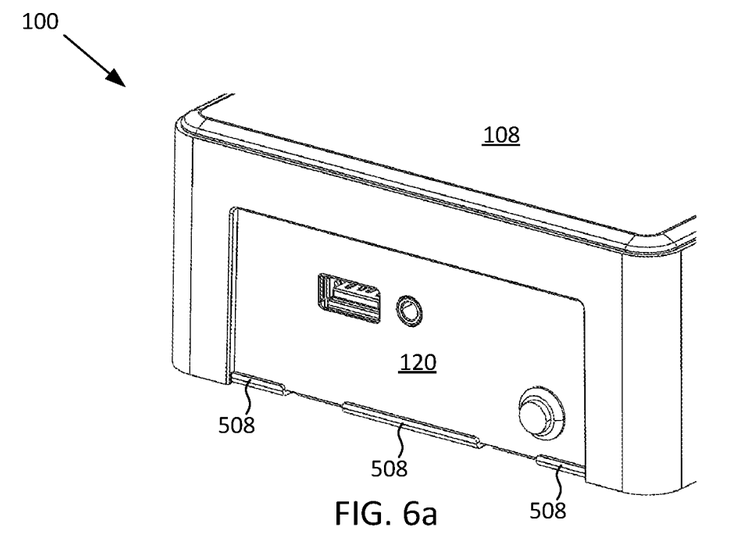
FIGS. 6a and 6b are perspective view diagrams illustrating examples of the bottom panel securing the front and rear I/O panels respectively, according to examples of the subject disclosure.
Figure 6B:
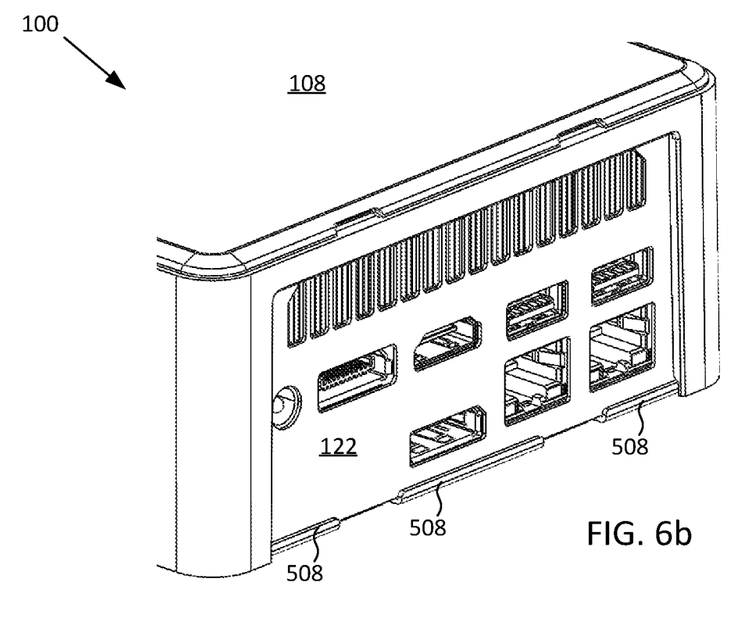

FIGS. 6a and 6b are perspective view diagrams illustrating examples of the bottom panel 502 securing the front and rear I/O panels 120, 122 respectively, according to examples of the subject disclosure. As discussed above, tabs 508 of the bottom panel 502 engage the front and rear I/O panels 120, 122 to position and maintain the front and rear I/O panels 120, 122 within I/O openings 506 of the chassis 204. In the depicted examples, the tabs 508 are offset so that adjacent ones of the tabs 508 alternate between extending inward and outward. Therefore, the outwardly extending tabs 508 are visible in FIGS. 6a and 6b.

Figure 7A:
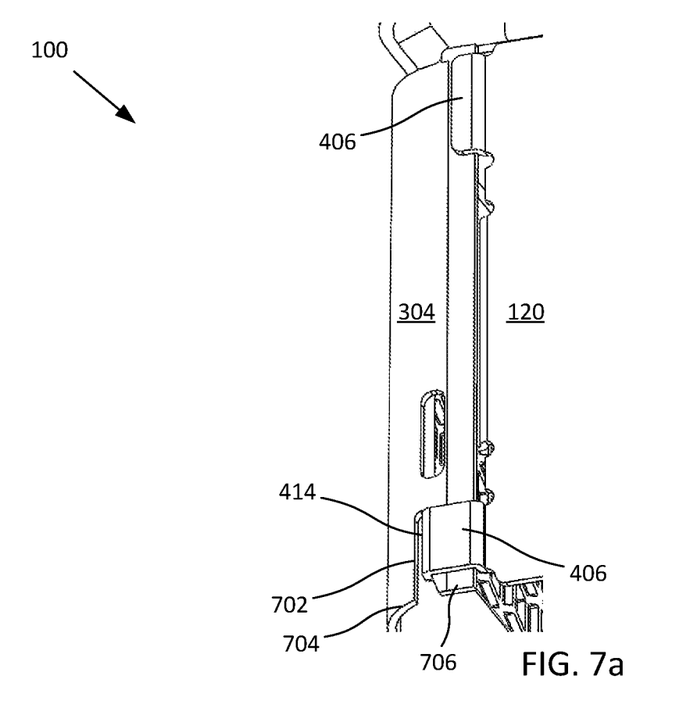
FIG. 7a is a perspective partial-view diagram of a front I/O panel and a side panel, according to examples of the subject disclosure.

FIG. 7a is a perspective partial-view diagram of a front I/O panel 120 and a side panel 304, according to examples of the subject disclosure. Although described and depicted with reference to the front I/O panel 120, the concepts described here apply equally to the rear I/O panel 122. In the depicted embodiment, the outer side tabs 406 engage an outer surface of the side panel 304. The return flange 414, in certain examples, is configured to engage a slot 702 formed in the side panel. The slot 702 may extend upward from a bottom edge 704 of the side panel 304 a distance that is sufficient to receive the return flange 414. Adjacent the slot 702, in some examples, is a wedge-shaped tab 706 that is configured to form a friction fit mating with the side tab 406 and return flange 414.

Figure 7B:
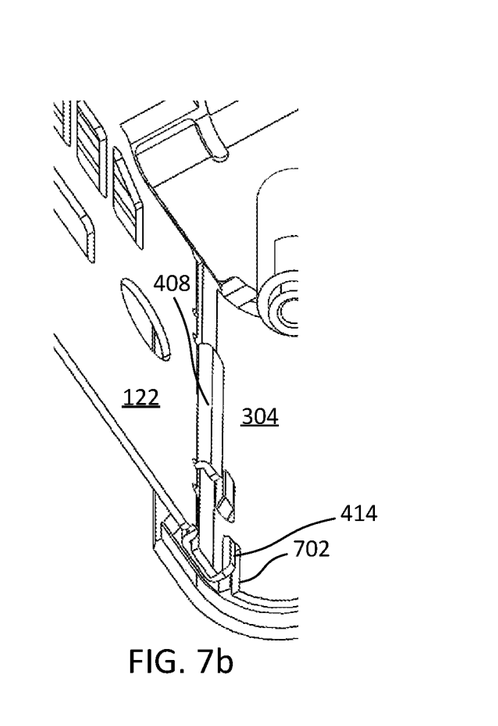
FIGS. 7b and 7c are perspective partial-view diagrams illustrating interior areas of the chassis, according to examples of the subject disclosure.
Figure 7C:
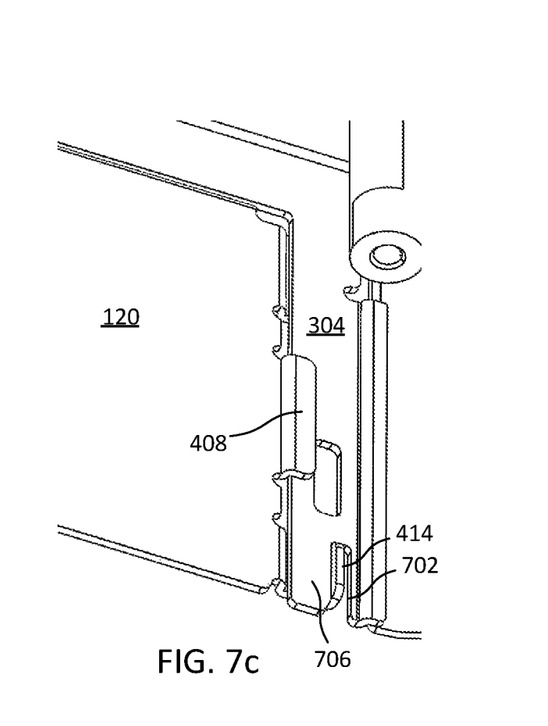

FIGS. 7b and 7c are perspective partial-view diagrams illustrating interior areas of the chassis 204, according to examples of the subject disclosure. In the depicted embodiments, the front I/O panel 120 (see FIG. 7c) and the rear I/O panel 122 (see FIG. 7b) engage the side panel 304 of the chassis 204. The inwardly extending side tab 408 engages an interior surface of the side panel 304. In certain examples, the return flange 414 engages the slot 702 and the wedge-shaped tab 706 to secure either the front or rear I/O panel 120, 122 to the side panel 304 of the chassis 204.

Figure 8A:
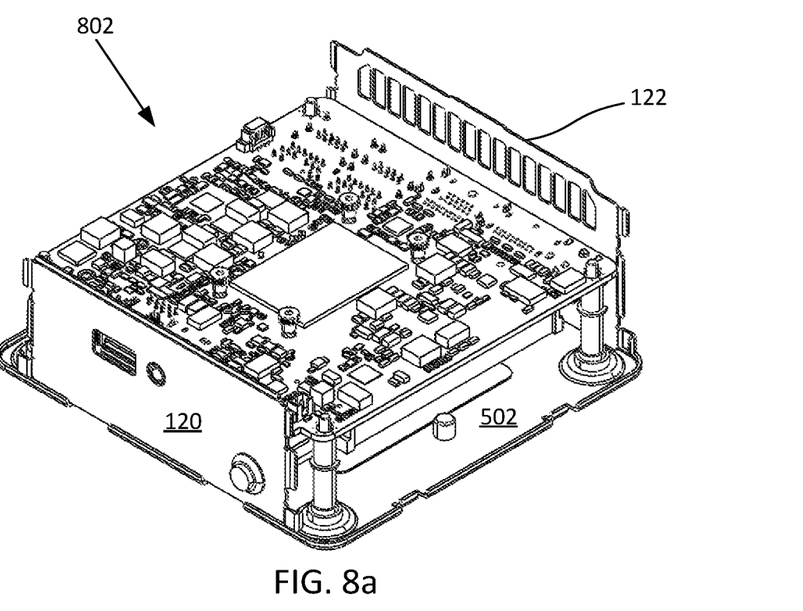
FIGS. 8a and 8b are perspective view diagrams illustrating examples of the bottom panel, according to examples of the subject disclosure.
Figure 8B:
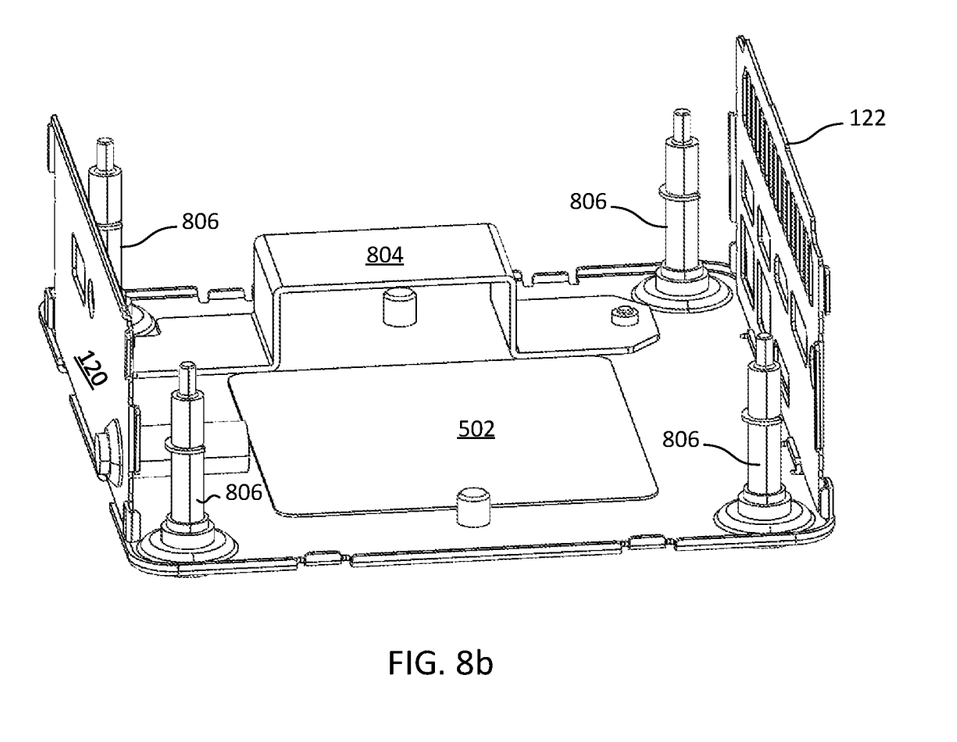

FIGS. 8a and 8b are perspective view diagrams illustrating examples of the bottom panel 502, according to examples of the subject disclosure. FIG. 8a, in particular, depicts the bottom panel 502, the front I/O panel 120, the rear I/O panel 122, and a motherboard 802. FIG. 8b depicts the bottom panel 502 without the motherboard 802 and other common computing components. The motherboard 802 may be a small form factor motherboard containing the essential I/O ports and interfaces to facilitate communication between computing components known to those of skill in the art, including but not limited to, processors, memory, networks, computer-readable storage media, monitors, etc.

In certain examples, the front I/O panel 120 is positioned adjacent a first edge of the motherboard 802 while the rear I/O panel 122 is positioned adjacent an opposite second edge of the motherboard 802. In other words, the enclosure 100 is configured with modular or replaceable I/O panels that are disposed adjacent opposite sides of the motherboard 802 so that I/O interfaces of the opposite sides are accessible through either the front I/O panel 120 or the rear I/O panel 122.

It is to be understood that other components and structures may be implemented within the chassis 204. Examples of other components include, but are not limited to, cooling plates 804, or other structural elements that support the motherboard 802, power supply, etc. Adjustable standoffs 806 may be coupled to the bottom panel 502 and/or top plate. The standoffs 806, in certain examples, are configured to locate and support the motherboard 802. The position of the motherboard 802 with reference to the chassis 204 may be adjusted upward towards a top plate disposed on the top side 108 or downward toward the bottom panel 502 depending on the specific I/O layout of the motherboard 802.

Figure 9:
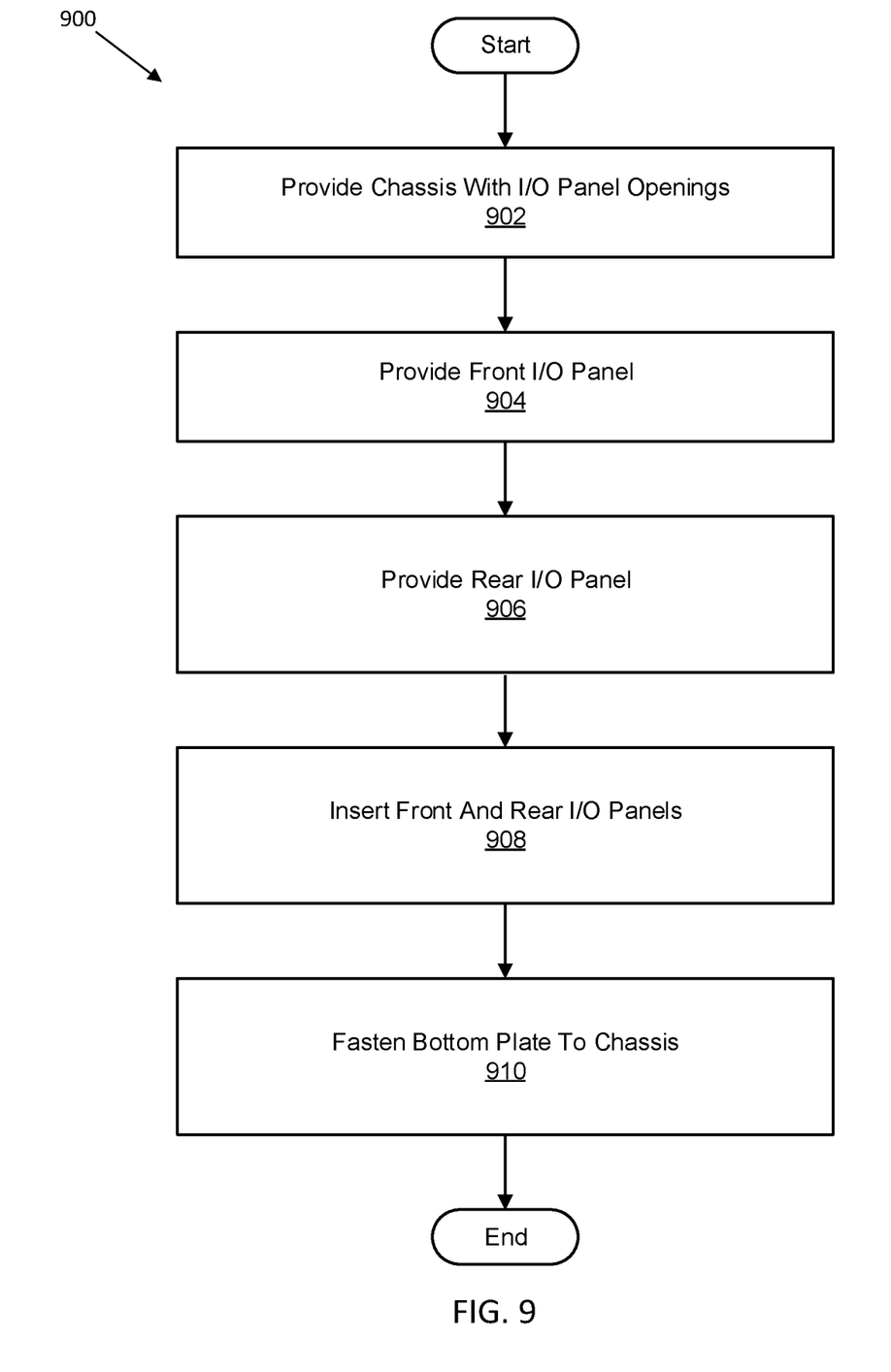
FIG. 9 is a schematic flowchart diagram illustrating one example of a method of assembling a computer enclosure, according to examples of the subject disclosure.

FIG. 9 is a schematic flowchart diagram illustrating one example of a method 900 of assembling a computer enclosure 100, according to examples of the subject disclosure. In certain examples, the method 900 starts and includes providing, at block 902, a chassis 204 having I/O panel openings. In some examples, the chassis 204 is configured with a height, length, and width to accommodate a motherboard and position a front I/O panel adjacent to one edge of the motherboard and position a rear I/O panel adjacent an opposite edge of the motherboard. Stated differently, the chassis is provided with length and width dimensions, in certain examples, that are approximately equivalent to the motherboard. As used herein, the term "approximately" refers to values that are about 1-5% larger than the referenced value. In other words, the length and width of the chassis are just larger than the motherboard, or sufficient to receive the motherboard.

At block 904, the method 900 includes providing the front I/O panel. In certain examples, the front I/O panel is provided with locating and positioning tabs as described above. Likewise, the rear I/O panel is provided, at block 906, with locating and positioning tabs. At block 908, the method 900 includes inserting the front I/O panel and the rear I/O panel. At block 910, the method 900 includes fastening the bottom panel to the chassis.

Figure 10:
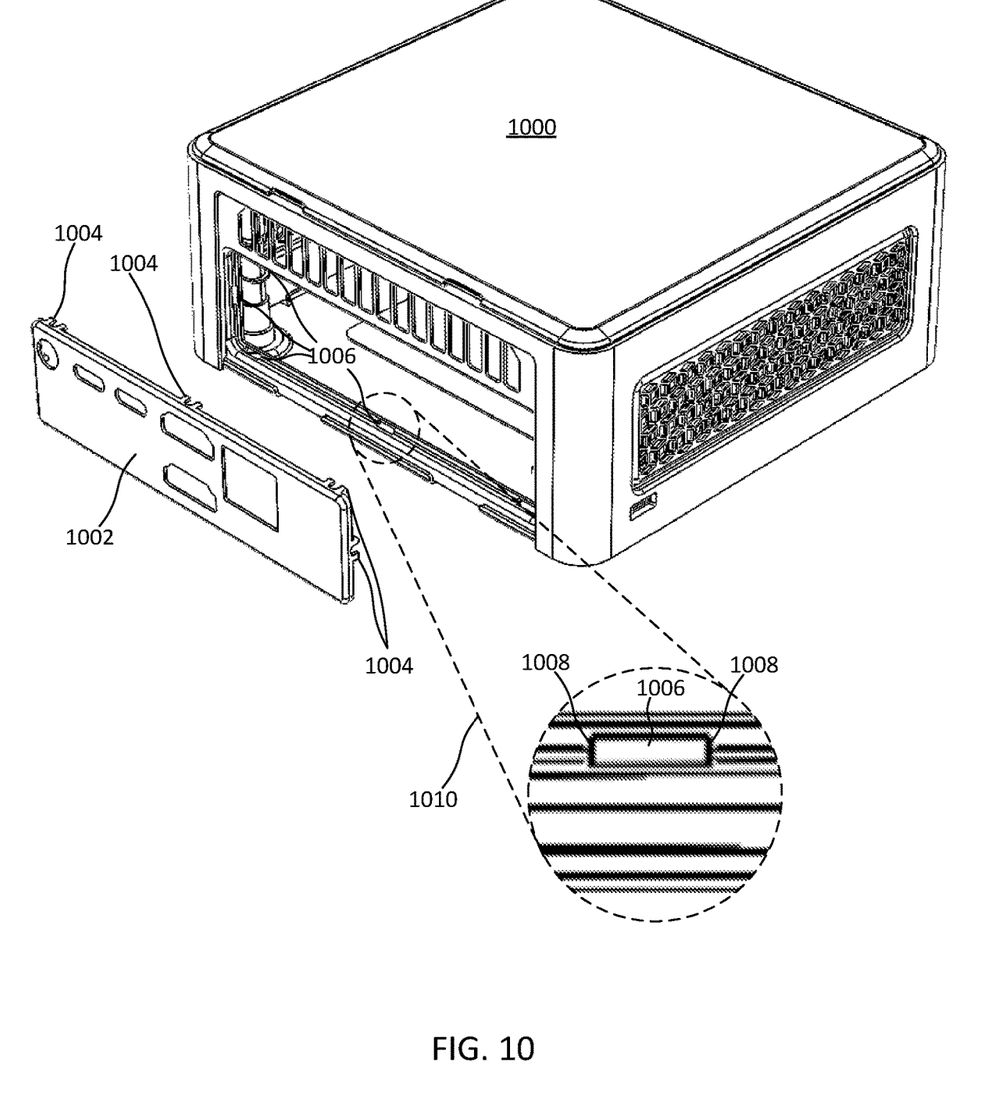
FIG. 10 is a perspective view diagram illustrating examples of a snap-in I/O panel, according to examples of the subject disclosure.

FIG. 10 is a perspective view diagram illustrating another example of an I/O panel 1002, according to examples of the subject disclosure. In certain examples, the I/O panel 1002 is formed with one or more snap connectors 1004 that are positioned around a perimeter of the I/O panel 1002. The positioning of the snap connectors 1004 corresponds and aligns with slots 1006 formed in an opening of the enclosure 1000. Although not depicted here, an I/O panel with snap connectors 1004 may be positioned on the opposite side of the enclosure, as is described above.

The snap connectors 1004 may be integrally formed with the I/O panel 1002. In certain examples, the I/O panel is formed of a rigid material such as metal, plastic, or some rigid composite material. The snap connectors 1004 may include protrusions that extend outward to engage side surfaces 1008 of the slots 1006, as depicted in callout 1010. The protrusions removably secure the I/O panel 1002 to the enclosure 1000. Beneficially, providing a new I/O panel to accommodate different motherboards is faster and more economic than designing a new enclosure 1000 for each model of motherboard available.

This description uses examples to describe embodiments of the disclosure and also to enable any person skilled in the art to practice the embodiments, including making and using any devices or systems and performing any incorporated methods. The patentable scope of the disclosure is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer chassis comprising:
   a top, a bottom, a front side, a back side that is opposite the front side, a left side, and a right side that is opposite the left side;
   a front input/output (I/O) opening formed in the front side and configured to receive a front I/O panel, where the front I/O panel comprises a first tab configured to engage an interior surface of the computer chassis and a second tab configured to engage an exterior surface of the computer chassis;
   a rear I/O opening in the back side and configured to receive a rear I/O panel, where the rear I/O panel comprises a first tab configured to engage an interior surface of the computer chassis and a second tab configured to engage an exterior surface of the computer chassis; and
   a bottom panel comprising:
      a first upwardly extending tab configured to engage an outer surface of the front I/O panel;
      a second upwardly extending tab configured to engage an inner surface of the front I/O panel;
      a third upwardly extending tab configured to engage an outer surface of the rear I/O panel; and
      a fourth upwardly extending tab configured to engage an inner surface of the rear I/O panel.

2. The computer chassis of claim 1, further comprising a shell disposed around the computer chassis.

3. The computer chassis of claim 2, where the shell comprises openings configured to receive the front I/O panel.

4. The computer chassis of claim 1, where the rear I/O panel is configured with a layout of I/O openings that conform with a layout of I/O ports of a selected motherboard.

5. The computer chassis of claim 4, where the rear I/O panel includes inwardly extending tabs and outwardly extending tabs configured to engage with inner surfaces and outer surfaces, respectively, of the computer chassis.

6. The computer chassis of claim 5, where at least one of the inwardly extending tabs and the outwardly extending tabs includes a return flange.

7. The computer chassis of claim 1, where the front I/O panel is configured with a layout of I/O openings that conform with a layout of I/O ports or buttons of a selected motherboard.

8. The computer chassis of claim 7, where the front I/O panel includes inwardly extending tabs and outwardly extending tabs configured to engage with inner surfaces and outer surfaces, respectively, of the computer chassis.

9. The computer chassis of claim 1, where a top panel of the top comprises a downwardly extending lip configured to locate the rear I/O panel.

10. A computer chassis comprising:
    a top, a bottom, a front side, a back side that is opposite the front side, a left side, and a right side that is opposite the left side;
    a front input/output (I/O) opening formed in the front side and configured to receive a front I/O panel, where the front I/O panel comprises at least one snap connector configured to engage a slot of the computer chassis;
    a rear I/O opening in the back side and configured to receive a rear I/O panel; and
    a bottom panel comprising:
       a first upwardly extending tab configured to engage an outer surface of the front I/O panel;
       a second upwardly extending tab configured to engage an inner surface of the front I/O panel;
       a third upwardly extending tab configured to engage an outer surface of the rear I/O panel; and
       a fourth upwardly extending tab configured to engage an inner surface of the rear I/O panel.

11. The computer chassis of claim 10, where the rear I/O panel comprises at least one snap connector configured to engage a slot of the computer chassis.

12. The computer chassis of claim 10, further comprising a shell disposed around the computer chassis.

13. The computer chassis of claim 10, where the rear I/O panel is configured with a layout of I/O openings that conform with a layout of I/O ports of a selected motherboard.

14. The computer chassis of claim 13, where the front I/O panel is configured with a layout of I/O openings that conform with a layout of I/O ports or buttons of a selected motherboard.

15. The computer chassis of claim 14, where each of the front I/O panel and the rear I/O panel comprises a perimeter, and a plurality of snap connectors disposed on the perimeter.

16. The computer chassis of claim 15, where each of the plurality of snap connectors is positioned and aligned with a corresponding slot formed in either the front I/O opening or the rear I/O opening.

17. A method of forming a computer chassis, the method comprising:
- providing a top, a bottom, a front side, a back side that is opposite the front side, a left side, and a right side that is opposite the left side;
- providing a front input/output (I/O) opening formed in the front side and configured to receive a front I/O panel, where the front I/O panel comprises at least one snap connector configured to engage a slot of the computer chassis;
- providing a rear I/O opening in the back side and configured to receive a rear I/O panel;
- providing a bottom panel comprising:
  - a first upwardly extending tab configured to engage an outer surface of the front I/O panel;
  - a second upwardly extending tab configured to engage an inner surface of the front I/O panel;
  - a third upwardly extending tab configured to engage an outer surface of the rear I/O panel;
  - a fourth upwardly extending tab configured to engage an inner surface of the rear I/O panel; and
- inserting the front I/O panel in the front I/O opening, and inserting the rear I/O panel in the rear I/O opening.

18. The method of claim 17, further comprising attaching a shell to the computer chassis.

* * * * *